(12) United States Patent
Gan et al.

(10) Patent No.: US 7,789,354 B2
(45) Date of Patent: Sep. 7, 2010

(54) ADJUSTABLE SUPPORT MECHANISM FOR DISPLAY DEVICES AND SUPPORT STAND UTILIZING THE SAME

(75) Inventors: Wen-Lin Gan, Shenzhen (CN); Yi-Xiong Wang, Shenzhen (CN); Jun-Wu Duan, Shenzhen (CN); Chang-Sheng Fan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 120 days.

(21) Appl. No.: 12/171,265

(22) Filed: Jul. 10, 2008

(65) Prior Publication Data

US 2009/0166482 A1     Jul. 2, 2009

(30) Foreign Application Priority Data

Dec. 27, 2007   (CN) .................... 2007 1 0203500

(51) Int. Cl.
*A47F 5/00*      (2006.01)
*A47F 7/00*      (2006.01)
*F16M 11/00*     (2006.01)
*F16M 13/00*     (2006.01)

(52) U.S. Cl. .................... 248/125.8; 248/158; 248/161; 248/123.11; 248/125.2; 248/280.11; 248/284.1; 248/281.11; 248/121; 248/132; 248/404; 248/157; 248/918; 248/919; 248/920; 248/921; 248/922; 248/923; 361/679.21; 361/679.01; 361/679.02; 40/606.01; 40/606.03; 40/601

(58) Field of Classification Search ......... 248/917–924, 248/125.8, 158, 161, 123.11, 125.2, 280.11, 248/284.1, 281.11, 121, 132, 404, 157; 361/679.21, 361/679.01, 679.02; 40/606.01, 606.03, 40/601

See application file for complete search history.

(56) References Cited

U.S. PATENT DOCUMENTS

| 5,262,762 | A * | 11/1993 | Westover et al. ............. 345/168 |
| 7,168,665 | B2 * | 1/2007 | Hong et al. ............... 248/125.1 |
| 7,364,124 | B2 * | 4/2008 | Yuasa et al. ............... 248/125.8 |
| 7,474,522 | B2 * | 1/2009 | Bliven ................... 361/679.22 |
| 7,628,371 | B2 * | 12/2009 | Gan et al. .................... 248/422 |
| 7,637,463 | B2 * | 12/2009 | Yen et al. .................... 248/157 |
| 2005/0156092 | A1 * | 7/2005 | Shepherd et al. ............ 248/404 |
| 2005/0194499 | A1 * | 9/2005 | Drew et al. ............... 248/125.1 |
| 2005/0205731 | A1 * | 9/2005 | Shimizu et al. ........... 248/176.3 |

(Continued)

*Primary Examiner*—Anita M King
*Assistant Examiner*—Nkeisha J Smith
(74) *Attorney, Agent, or Firm*—Zhigang Ma

(57) ABSTRACT

An adjustable support mechanism (30) includes a fixed unit (70), an adjustable suspension unit (80) and a connecting unit (90). The adjustable suspension unit is slidably mounted on the fixed unit. The connecting unit is configured for connecting the fixed unit and the adjustable suspension unit. The connecting unit comprises a first elastic member (96) and an adjusting bracket (94). Opposite ends of the first elastic member are connected to the fixed unit and the adjustable suspension unit correspondingly. The adjusting bracket includes two rotary wheels (942, 945) and a coiling member (944) looped around the rotary wheels. The adjustable suspension unit is fixed to the coiling member. At least one of the rotary wheels is rotatable relative to the fixed unit to coil the coiling member around the rotary wheels, sliding the adjustable suspension unit relative to the fixed unit.

16 Claims, 6 Drawing Sheets

U.S. PATENT DOCUMENTS

2006/0185563 A1* 8/2006 Sweere et al. .................. 108/28
2007/0146987 A1* 6/2007 Sakata et al. ................. 361/683
2007/0259554 A1* 11/2007 Lindblad et al. ............ 439/354
2009/0001239 A1* 1/2009 Dong et al. .................. 248/393
2009/0230261 A1* 9/2009 Su ............................. 248/161

* cited by examiner

ADJUSTABLE SUPPORT MECHANISM FOR DISPLAY DEVICES AND SUPPORT STAND UTILIZING THE SAME

BACKGROUND OF THE INVENTION

1. Field of the Invention

The present invention relates generally to adjustable supports for display devices and, more particularly, to an adjustable support mechanism for a display device and a support stand utilizing the mechanism.

2. Discussion of the Related Art

Currently, flat-panel display devices such as liquid crystal display (LCD) devices are widely used due to excellent display quality and thin profile. Typically, repositioning of the display device is accomplished via a support stand having an adjustable support mechanism.

Referring to FIG. 6, a typical adjustable support mechanism 10 for repositioning a flat-panel display device includes a support member 11, an elevating member 12, a spring 13, a shaft 131, and four fastening members 133, 136. The support member 11 includes a base plate 112 and two side plates 113 perpendicularly extending from opposite sides of the base plate 112. A flange 114 is formed around an end of each side plate 113 opposite to the base plate 112. The base plate 112, the side plates 113, and the flanges 114 cooperatively define a receiving groove 116 receiving the elevating member 12. Two guide rails 117 are formed on the inner surfaces of the side plates 113 correspondingly. Each of the flanges 114 defines a fixing hole 115 adjacent at an end. The elevating member 12 is slidably mounted onto the support member 11. The elevating member 12 includes a connecting portion 121 connecting the LCD panel on a top side, and defines two positioning holes 122 at a bottom side. The elevating member 12 forms two sliding portions 123 engaging the guide rails 117. The shaft 131 defines two through holes 1311 in opposite ends. An end of the spring 13 is sleeved on the shaft 131, and the other end of the spring 13 defines two through holes 132.

During assembly of the stand 10, the elevating member 12 is inserted into the support member 11. Each fastening member 133 extends through one corresponding through hole 1311 of the shaft 131 and one corresponding fixing hole 115 of the flanges 114, fixing the shaft 131 to the support member 11. Each fastening member 136 extends through corresponding through hole 132 of the spring 13 and a corresponding positioning hole 122 of the elevating member 12, fixing the spring 13 to the elevating member 12. In use, the elevating member 12 can be slid on the support member 11 by an external force. When the external force is removed, the liquid crystal display panel connected to the elevating member 12 can be fixed at a predetermined position, due to the weight of the liquid crystal display panel and the elevating member 12 being balanced, elastic force of the spring 13, and friction force between the elevating member 12 and the support member 11.

However, when adjusting the height of the elevating member 12 relative to the support member 11, the display screen or the elevating member 12 must be moved with two hands, presenting inconvenience of use.

Therefore, an adjustable support mechanism for display devices to solve the described problems is called for.

SUMMARY

An exemplary adjustable support mechanism for a display device includes a fixed unit, an adjustable suspension unit and a connecting unit. The adjustable suspension unit is slidably mounted on the fixed unit. The connecting unit is configured for connecting the fixed unit and the adjustable suspension unit. The connecting unit includes a first elastic member and an adjusting bracket. Opposite ends of the first elastic member are connected to the fixed unit and the adjustable suspension unit correspondingly. The adjusting bracket includes two rotary wheels and a coiling member looped around the rotary wheels. The adjustable suspension unit is fixed to the coiling member. At least one of the rotary wheels is rotatable relative to the fixed unit to rotate the coiling member around the rotary wheels, rendering the adjustable suspension unit slidable relative to the fixed unit.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the adjustable support mechanism for flat-panel display devices and the support stand. Moreover, in the drawings, like reference numerals designate corresponding parts throughout the several views.

DETAILED DESCRIPTION OF THE EMBODIMENTS

Figure 1:
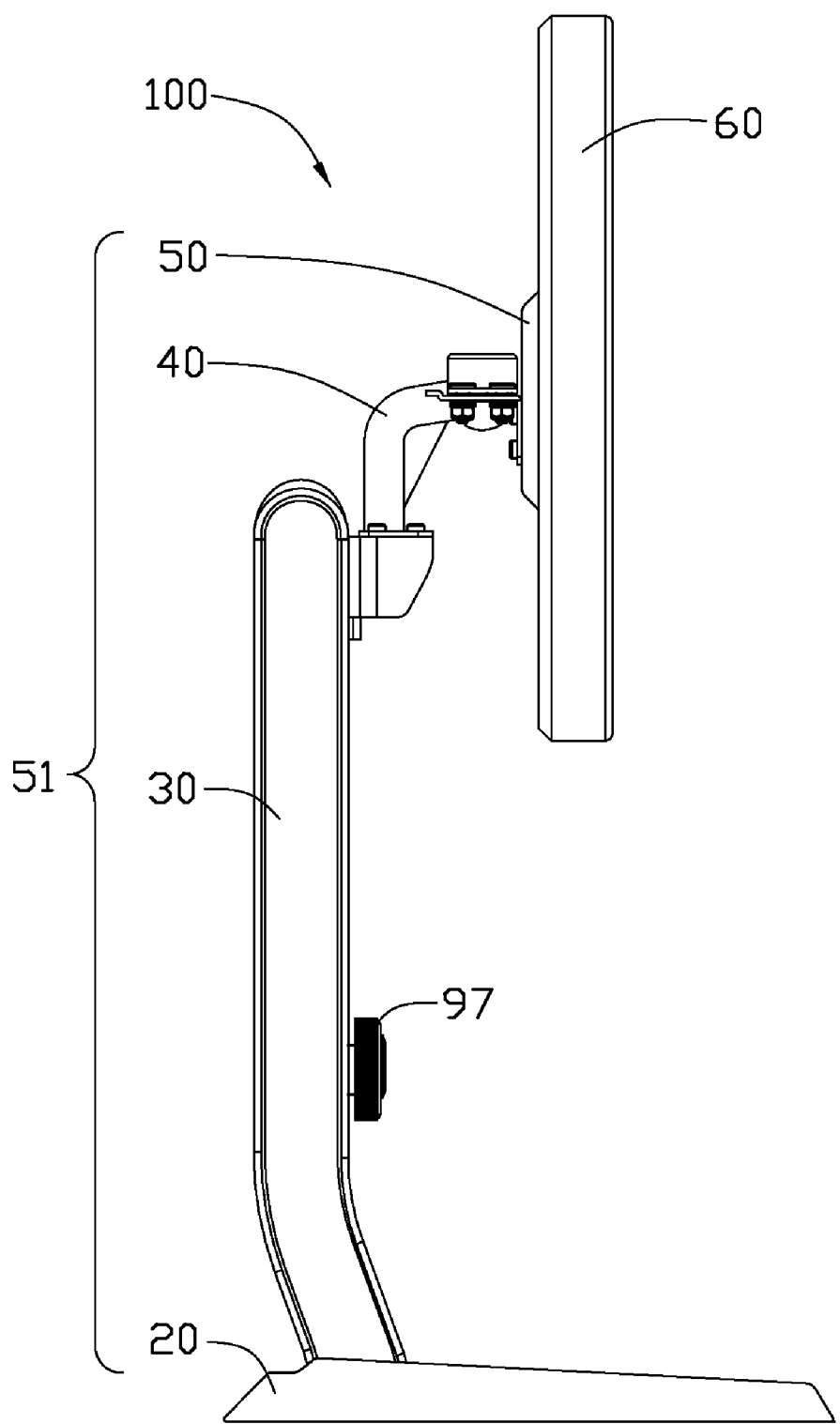
FIG. 1 is a side view of a flat-panel display device having an adjustable support mechanism in accordance with an exemplary embodiment.

An adjustable support mechanism according to an exemplary embodiment of the present invention is applicable for use in a flat-panel display device such as a liquid crystal display device. A support stand with the adjustable support mechanism is also provided. Referring to FIG. 1, a flat-panel display device 100 includes a base 20, an adjustable support mechanism 30, a ball joint 40, a supporting bracket 50, and a display screen 60 supported by the supporting bracket 50. The base 20 is configured for supporting the other components of the flat-panel display device 100. The adjustable support mechanism 30 is mounted on the base 20, and the ball joint 40 is connected between the adjustable support mechanism 30 and the supporting bracket 50. A support stand 51 includes the base 20, the adjustable support mechanism 30, the ball joint 40, and the supporting bracket 50.

Figure 2:
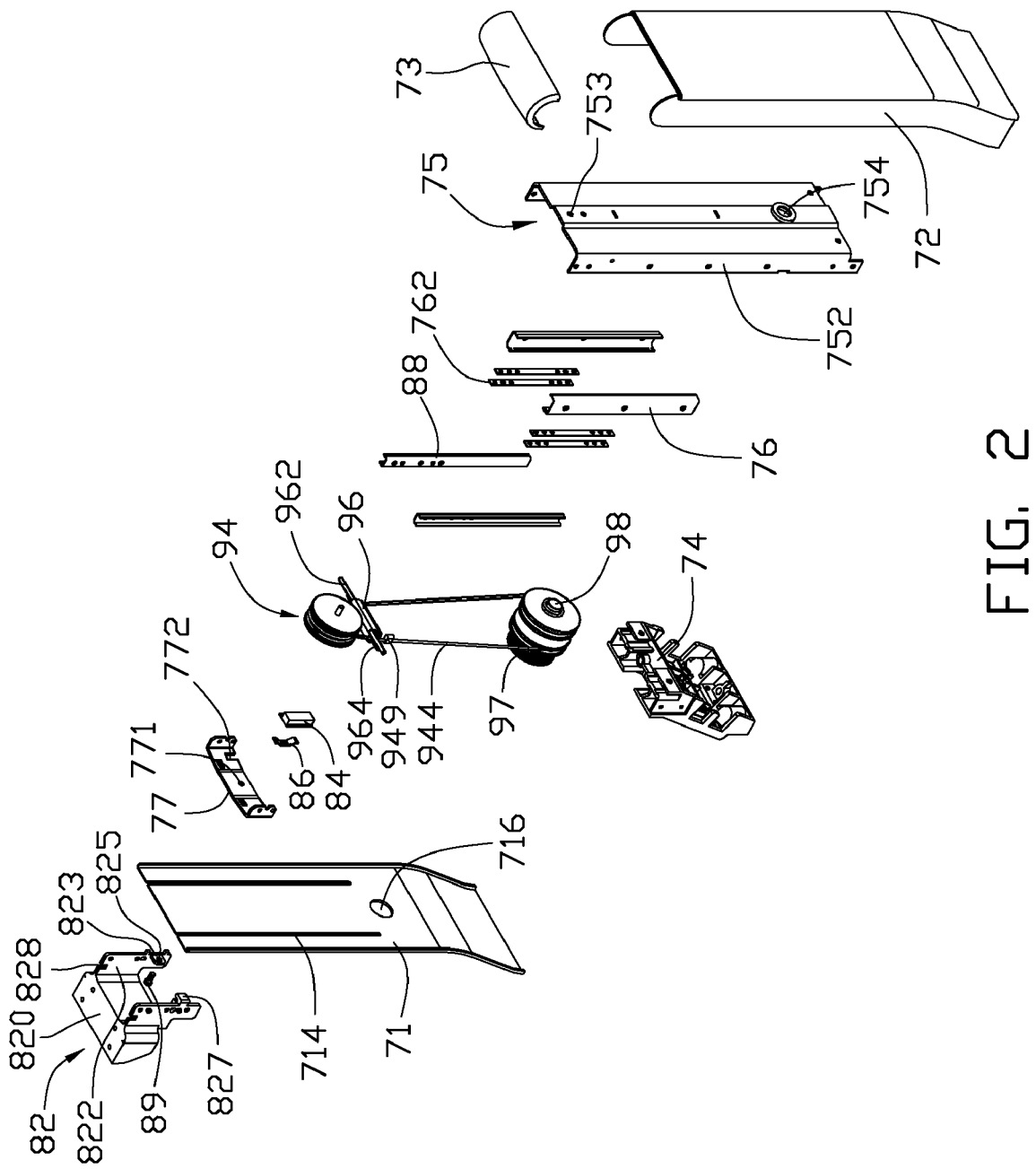
FIG. 2 is an exploded, isometric view of the adjustable support mechanism in FIG. 1.
Figure 5:
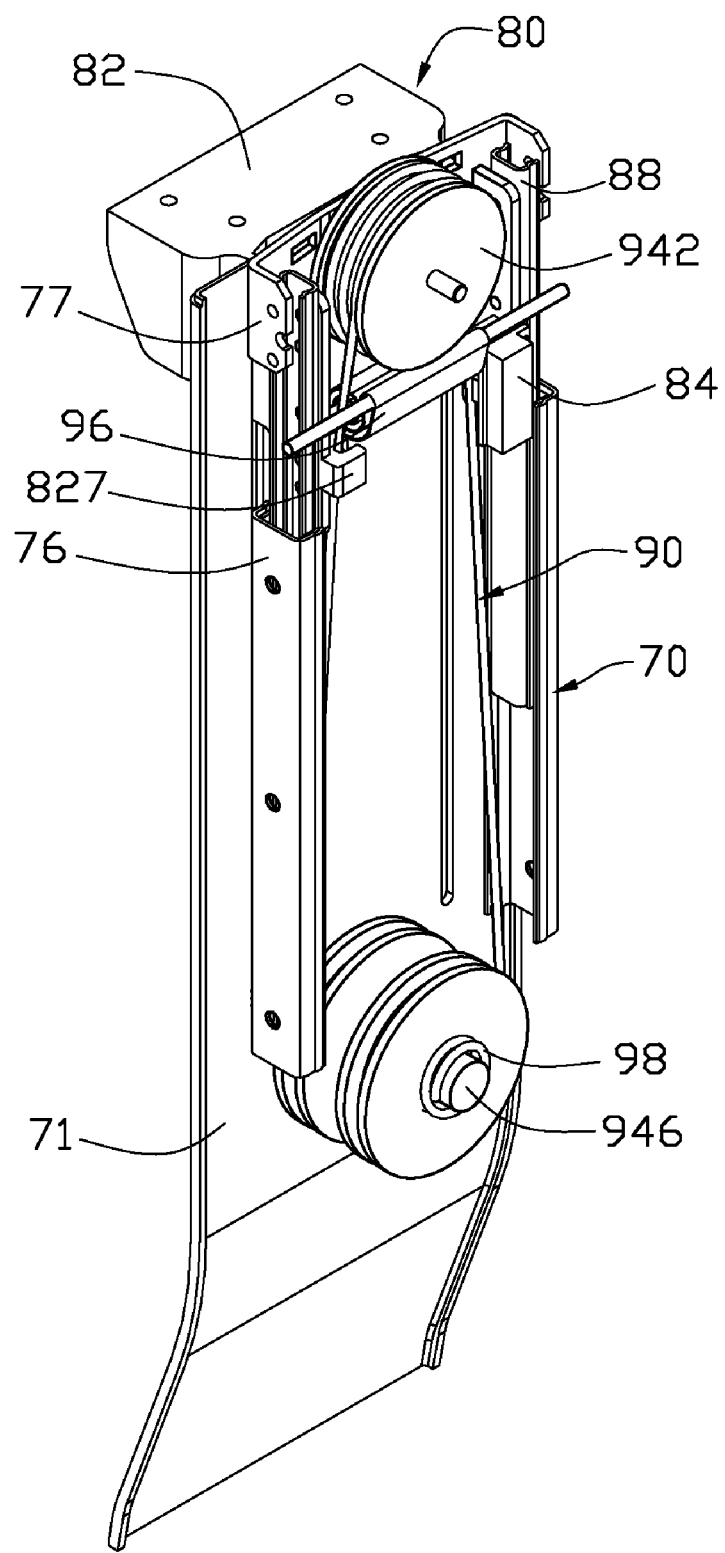
FIG. 5 is an assembled, isometric view of the adjustable support mechanism for the flat display device in FIG. 2.
Figure 6:
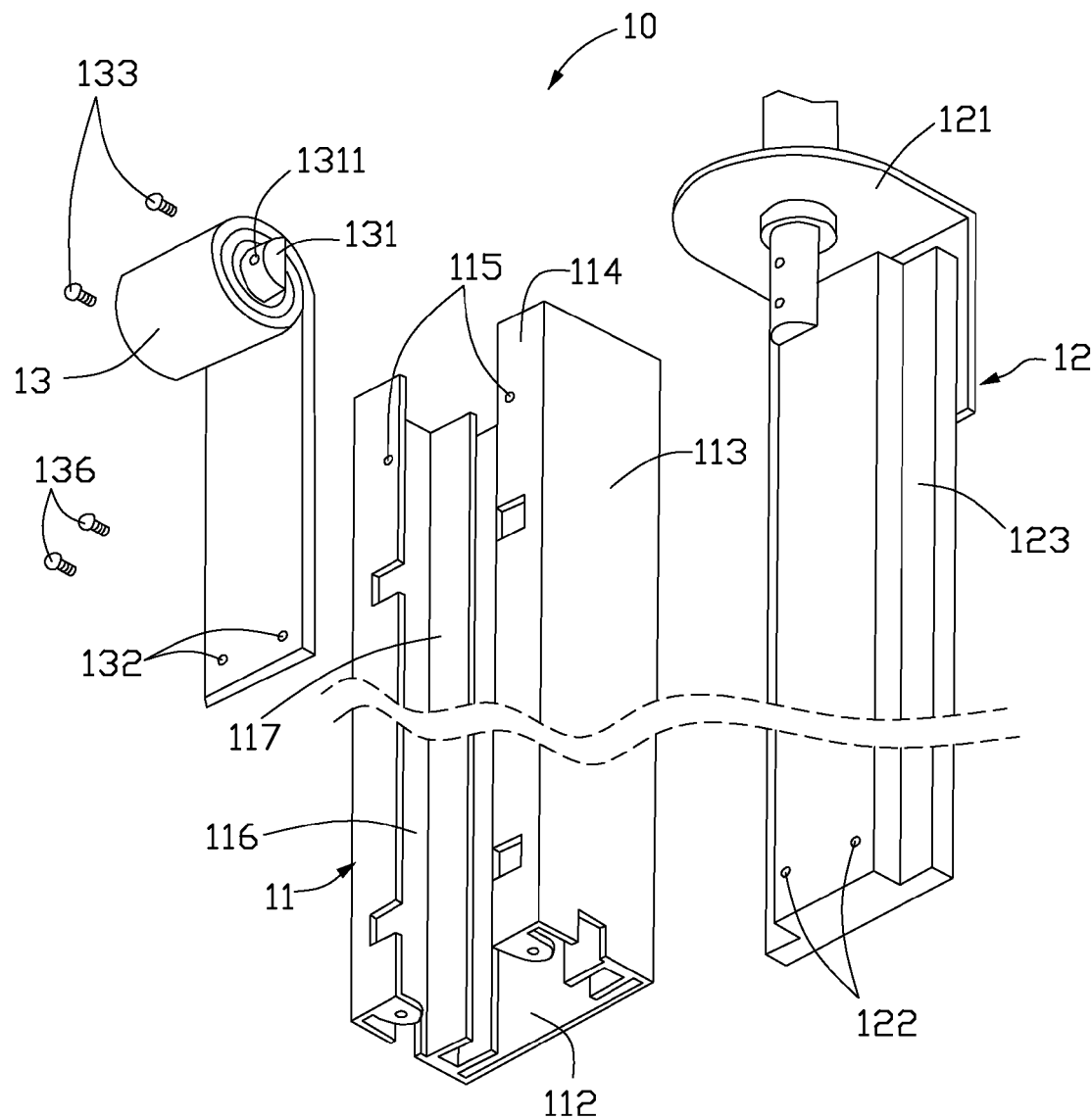
FIG. 6 is an exploded, isometric view of a conventional adjustable support mechanism.

Referring to FIG. 2 and FIG. 5, the adjustable support mechanism 30 includes a fixed unit 70, an adjustable suspension unit 80, and a connecting unit 90 connecting the fixed unit 70 and the adjustable suspension unit 80.

The fixed unit 70 includes a front cover 71, a rear cover 72, a top cover 73, a strengthening member 74, a middle sheet 75, two rails 76, two pairs of bearing supports 762, and a limiting piece 77.

The front cover 71 is substantially a rectangular sheet. The front cover 71 defines two parallel gaps 714 extending from one end toward, but maintaining a distance from, another end.

The front cover 71 further defines a knob hole 716 in the middle portion of the front cover 71 and adjacent to the end opposite to the gaps 714 extending from. The rear cover 72 is a sheet with two flanges (not labeled) configured for coupling the rear cover 72 to the front cover 71. The top cover 73 is configured for mounting on a top of the front cover 71 and the rear cover 72, thus forming a frame and defining a cavity for receiving most of other components of the adjustable support mechanism 30. The strengthening member 74 is disposed in a bottom of the cavity, and configured for fixing to the base 20.

The middle sheet 75 includes a main sheet (not labeled) and two sidewalls 752 formed at opposite sides of the main sheet. The middle sheet 75 is disposed between and fixed to the front cover 71 and the rear cover 72. The middle sheet 75 defines a shaft hole 753 at a top portion and a positioning hole 754 at a bottom portion of the main sheet. The positioning hole 754 corresponds to the knob hole 716 of the front cover 71. The middle sheet 75 is fixed to the strengthening member 74, thus fixing the front cover 71, the rear cover 72, the top cover 73, the middle sheet 75, and the base 20 relative to each other.

The rails 76 are fixed on the sidewalls 752 of the middle sheet 75. The limiting piece 77 defines a shaft hole 771 in the center, and a notch 772 at an edge. The limiting piece 77 is fixed on a top portion of the middle sheet 75.

The adjustable suspension unit 80 includes a load support 82, a friction block 84, an elastic piece 86, two slide rails 88, and an adjusting bolt 89.

The load support 82 includes a main portion 820, and two side sheets 822 perpendicularly extending from opposite sides of the main portion 820 correspondingly. The load support 82 is fixed to the ball joint 40 via the main portion 820. The side sheets 822 of the load support 82 are configured for insertion into the gaps 714 of the front cover 71, thus the load support 82 is slidable relative to the front cover 71 along the gaps 714. A slot 828 is defined in each of the side sheets 822. A fixing piece 823 is formed on an edge of one of the side sheets 822. The fixing piece 823 defines a threaded hole 825 in the center. A locking block 827 is formed on an edge of the other one of the side sheets 822. The fixing piece 823 faces and corresponds to the locking block 827.

The friction block 84 is a block made of plastic. The friction block 84 is configured for fixed connection to the load support 82 and corresponding to the fixing piece 823. The elastic piece 86 is configured for disposal between the fixing piece 823 and the friction block 84. The elastic piece 86 defines a hole (not labeled). The adjusting bolt 89 is configured for engaging the threaded hole 825 of the load support 82, protruding through the elastic piece 86, and resisting the friction block 84. Alternatively, the adjusting bolt 89 may be replaced by other adjusting members such as a threaded pole engaged with a nut. The slide rails 88 configured for engaging the rails 76 have shapes substantially similar to the rails 76.

The connecting unit 90 includes an adjusting bracket 94, a first elastic member 96, two shafts 962, 964, a knob 97, and a second elastic member 98.

Figure 4:
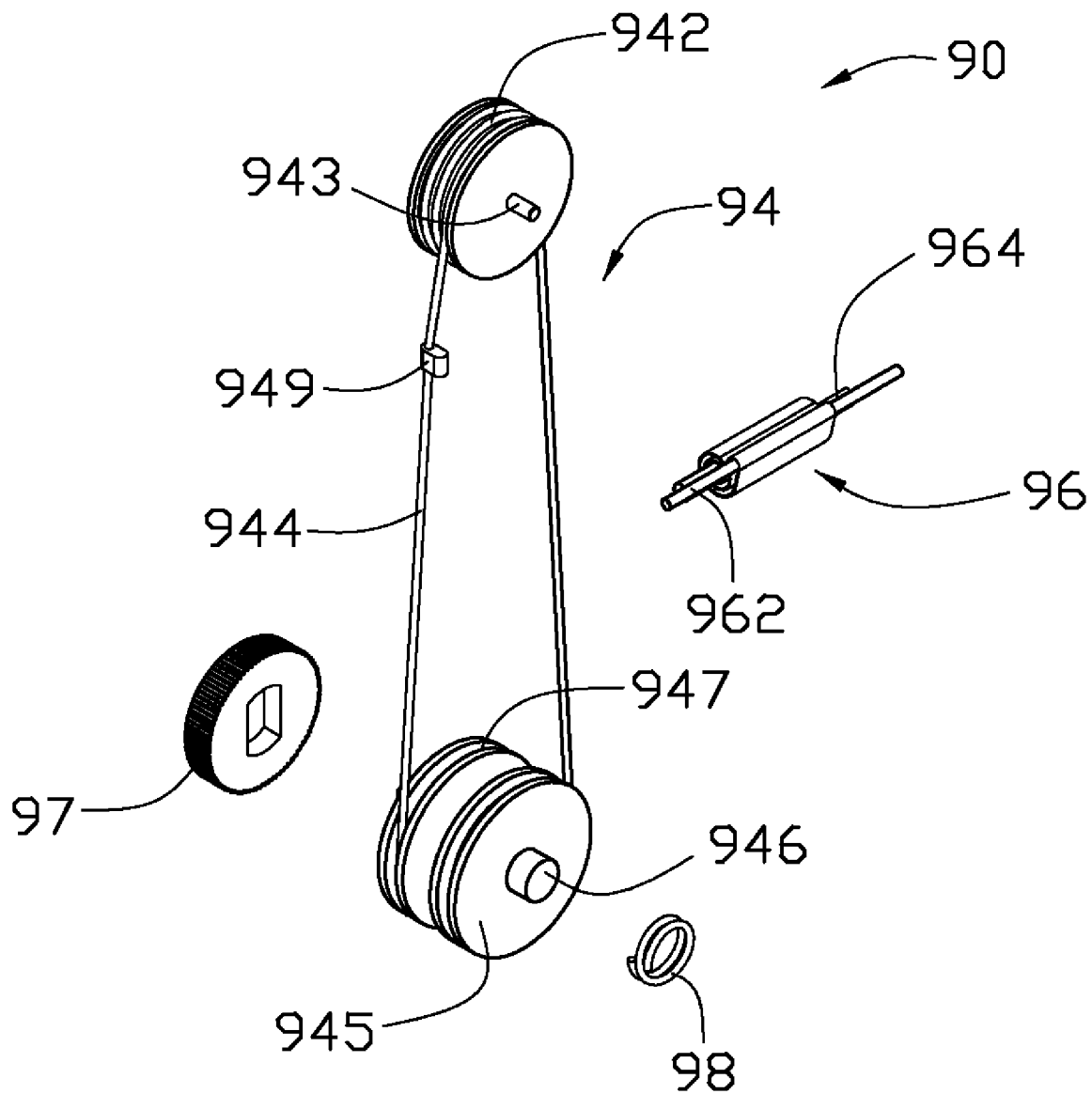
FIG. 4 is a partial assembled, isometric view of the adjustable support mechanism in FIG. 2.

Referring to FIG. 2 and FIG. 4, the adjusting bracket 94 includes a pulley wheel 942, a cable 944, a wheel 945, and a positioning member 949 fixed on the cable 944. The pulley wheel 942 is a disc. A pulley wheel shaft 943 is inserted into a center of the pulley wheel 942. The pulley wheel 942 defines a plurality of grooves (not labeled) seating the cable 944. The wheel 945 is substantially a disc and includes a wheel shaft 946 extending outward at a center on opposite sides of the wheel 945. The first elastic member 96 is a compressed, column-shaped spring. The knob 97 is a disc. The second elastic member 98 is a coiled spring.

To assemble the adjustable support mechanism 30, as seen in FIGS. 2 and 5, the bearing supports 762 for receiving bearings (not labeled) are disposed on the rails 76. The rails 76 are fixed on the sidewalls 752 of the middle sheet 75 correspondingly. The middle sheet 75 is fixed to the rear cover 72, and the strengthening member 74 is fixed at the bottom of the rear cover 72. The slide rails 88 are fixed to the side sheets 822 of the load support 82 correspondingly. The side sheets 822 of the load support 82 are slidably inserted into the gaps 714 of the front cover 71. The limiting piece 77 is fixed on the top end of the front cover 71, so as to prevent the load support 82 from sliding out of the gaps 714 of the front cover 71. The friction block 84 is fixed to the load support 82 and disposed corresponding to the fixing piece 823. The adjusting bolt 89 engages the threaded hole 825 of the load support 82, runs through the hole of the elastic piece 86, and resists the friction block 84. As such, a friction force is created between the load support 82 and the middle sheet 75. Furthermore, when a relative position of the adjusting bolt 89 and the fixing piece 823 of the load support 82 is changed, the friction force is changed accordingly.

The connecting unit 90 is assembled as follows. The positioning member 949 is fixed on the cable 944. The cable 944 is coiled on the pulley wheel 942 and the wheel 945. The second elastic member 98 is sleeved on an end of the wheel shaft 946. Opposite ends of the first elastic member 96 are fixed to the shafts 962, 964 correspondingly.

Then, with the middle sheet 75 and the connecting unit 90 disposed between the front and rear covers 71, 72, the front cover 71 is coupled and fixed to the rear cover 72. Two ends of the shaft 964 are fixed to the load support 82, and two ends of the shaft 962 are fixed to the middle sheet 75. Two ends of the pulley wheel shaft 943 are inserted into the shaft hole 771 of the limiting piece 77 and the shaft hole 753 of the middle sheet 75 correspondingly. The locking block 827 of the load support 82 is fixed to the positioning member 949. One end of the wheel shaft 946 is inserted into the positioning hole 754 of the middle sheet 75, and an opposite end of the wheel shaft 946 protrudes out of the front cover 71 via the knob hole 716. The knob 97 is non-rotatably engaged with the protruding portion of the wheel shaft 946. The second elastic member 98 is disposed between the wheel 945 and the middle sheet 75 and is compressed when the adjustable support mechanism 30 has been assembled. The friction block 84 abuts the middle sheet 75.

Figure 3:
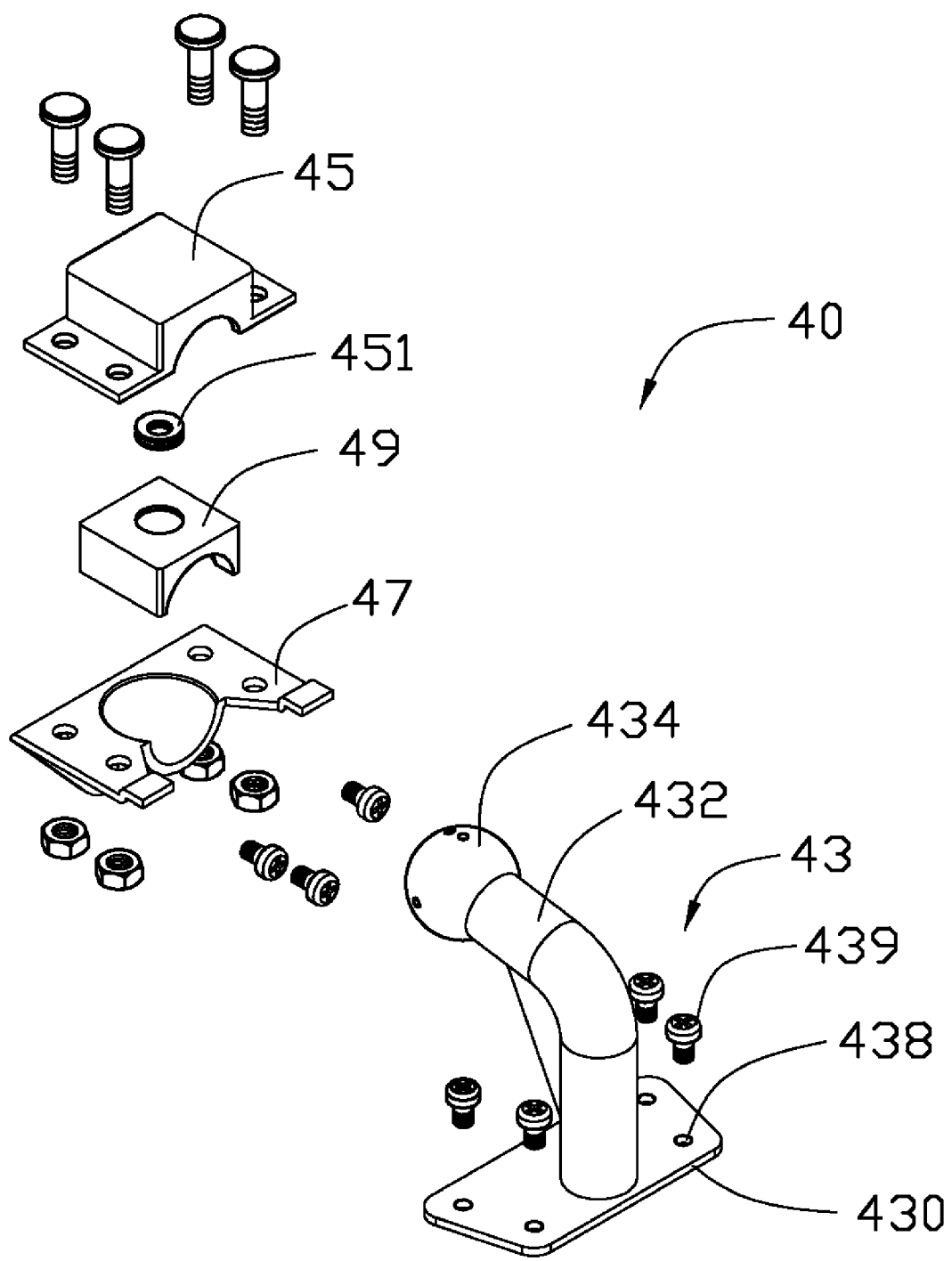
FIG. 3 is an exploded, isometric view of part of a support stand with the adjustable support mechanism.

Referring to FIG. 3, the ball joint 40 includes a rotatable member 43, a top plate 45, a bottom plate 47, and a frame 49.

The rotatable member 43 includes a basic plate 430, a bent connecting portion 432, and a rotatable portion 434. The basic plate 430 and the rotatable portion 434 are formed at opposite ends of the bent connecting portion 432. In this embodiment, the rotatable portion 434 is a sphere. The basic plate 430 defines a plurality of connecting holes 438. In assembly, the rotatable member 43 is fixed to the load support 82 via a plurality of bolts 439 engaging the connecting holes 438 and the load support 82. The frame 49 is received in the top plate 45. Each of the frame 49 and the bottom plate 47 defines a semi-spherical groove (not labeled) for receiving the rotatable portion 434. The ball joint 40 further includes an elastic piece 451 disposed between and resisting the top plate 45 and the frame 49. The bottom plate 47 is configured for fixing to the supporting bracket 50.

To assemble the ball joint 40, the rotatable portion 434 of the rotatable member 43 is disposed between the frame 49 and the bottom plate 47. Subsequently, the top plate 45, the bottom plate 47, and the frame 49 are coupled and fixed as an integrated unit for receiving the rotatable portion 434. Thus, the top plate 45, the bottom plate 47, and the frame 49 are versatile rotatable relative to the rotatable member 43.

If the height of the display screen 60 is to be adjusted, the knob 97 is rotated by an external force, thus rotating the wheel 945. The cable 944 moves relative to the wheel 945 and the pulley wheel 942. Thus, the load support 82 connected to the positioning block 949 moves together with the ball joint 40 and the display screen 60. The height of the display screen 60 is adjusted. That is, the height of the display screen 60 can be adjusted by rotating the knob 97. The adjustable support mechanism 30 is thus operable with only one hand, presenting improved convenience of use.

If the display screen 60 is adjusted to a desired height, the second elastic member 98 is compressed with opposite ends of the second elastic member 98 resisting the wheel 945 and the middle sheet 75, thus moving the wheel 845 towards the front cover 71. A friction force is created between the front cover 71 and the wheel 945 to prevent the wheel 945 from free rotation. When adjusting the height of the display screen 60, the knob 97 is pushed toward the rear cover 72 to move the wheel 945 away from the front cover 71, thus reducing or eliminating the friction force. The second elastic member 98 is further compressed. To end adjustment of the display screen 60, the knob 97 is released, thus the second elastic member 98 is reset by elastic force thereof and resists the wheel 945 again.

If the angle of the display screen 60 is to be adjusted, only an internal force is needed on the display screen 60. The angle of the display screen 60 can be adjusted to any direction via the ball joint 40.

Alternatively, the pulley wheel 942, the cable 944 and the wheel 945 can be replaced by other members. For example, the pulley wheel 942 and the wheel 945 can be replaced by two rotary wheels such as two chain wheels or two strap wheels. Accordingly, the cable 944 can be replaced by other coiling members such as a chain or a strap. The knob 97 can further be omitted, in which case wheel 945 is rotated directly.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An adjustable support mechanism for a display device, comprising:
    a fixed unit;
    an adjustable suspension unit slidably mounted on the fixed unit; and
    a connecting unit connecting the fixed unit and the adjustable suspension unit, the connecting unit comprising a first elastic member and an adjusting bracket, opposite ends of the first elastic member connected to the fixed unit and the adjustable suspension unit correspondingly, the adjusting bracket comprising two rotary wheels and a coiling member looped around the rotary wheels;
    wherein the adjustable suspension unit is fixed to the coiling member, and at least one of the rotary wheels is rotatable relative to the fixed unit to rotate the coiling member around the rotary wheels, sliding the adjustable suspension unit slide relative to the fixed unit;
    wherein the adjustable suspension unit further comprises a load support, a friction block, an elastic piece and an adjusting member, the load support further forms a fixing piece, the friction block is fixed on the load support and resists the fixed unit, and the adjusting member adjustably engages with the fixing piece of the load support, runs through the elastic piece and resists the friction block.

2. The adjustable support mechanism as claimed in claim 1, wherein the load support forms a locking block, the adjusting bracket further comprises a positioning member fixed on the coiling member, and the positioning member is fixed to the locking block.

3. The adjustable support mechanism as claimed in claim 1, wherein the two rotary wheels are a pulley wheel and a wheel, and the coiling member is a cable.

4. The adjustable support mechanism as claimed in claim 2, wherein the fixed unit comprises a front cover, a rear cover, a middle sheet, and a pair of rails fixed to the middle sheet, the front cover, the rear cover and the middle sheet are fixed relative to each other, the adjustable suspension unit further comprises a pair of slide rails slidably engaging the rails, and the slide rails are fixed on the load support.

5. The adjustable support mechanism as claimed in claim 4, wherein the connecting unit further comprises a second elastic member compressed between one of the rotary wheels and the rear cover, impelling the rotary wheel towards the front cover to create a friction force.

6. The adjustable support mechanism as claimed in claim 5, wherein the middle sheet is disposed between the front cover and the rear cover, and the adjustable suspension unit is disposed between the front cover and the middle sheet.

7. The adjustable support mechanism as claimed in claim 6, wherein the connecting unit further comprises a knob, the wheel partially protrudes out of the front cover, and the knob is non-rotatably engaged with the protruding portion of the wheel.

8. The adjustable support mechanism as claimed in claim 6, wherein the front cover defines two parallel gaps, and the load support forms two side sheets for insertion in the gaps correspondingly, allowing the load support to slide along the gaps relative to the front cover.

9. The adjustable support mechanism as claimed in claim 4, wherein the fixed unit further comprises a top cover, a limiting piece, and a strengthening member, the top cover is fixed on a top of the front cover, the rear cover and the middle sheet, the limiting piece is fixed on the top of the middle sheet, and the strengthening member is fixed on a bottom of the rear cover.

10. A support stand for display devices comprising:
    a base; and
    an adjustable support mechanism, comprising:
    a fixed unit fixed on the base;
    an adjustable suspension unit slidably mounted on the fixed unit; and
    a connecting unit connecting the fixed unit and the adjustable suspension unit, comprising a first elastic member and an adjusting bracket, wherein opposite ends of the first elastic member are connected to the fixed unit and the adjustable suspension unit correspondingly, and the adjusting bracket has two rotary wheels and a coiling member coiled on the rotary wheels;
        wherein the adjustable suspension unit is fixed to the coiling member, and at least one of the rotary wheels is rotatable relative to the fixed unit to coil the coiling member on the rotary wheels, thereby sliding the adjustable suspension unit relative to the fixed unit;
        wherein the adjustable suspension unit further comprises a load support, a friction block, an elastic piece and an adjusting member, the load support further forms a fixing piece, the friction block is fixed on the load support and resists the fixed unit, and the adjusting member adjustably engages with the fixing piece of the load support, runs through the elastic piece and resists the friction block.

11. The support stand as claimed in claim 10, wherein the load support forms a locking block, the adjusting bracket further comprises a positioning member fixed on the coiling member, and the positioning member is fixed to the locking block.

12. The support stand as claimed in claim 11, wherein the two rotary wheels are a pulley wheel and a wheel, and the coiling member is a cable.

13. The support stand as claimed in claim 11, wherein the fixed unit comprises a front cover, a rear cover, a middle sheet, and a pair of rails fixed to the middle sheet, the front cover, the rear cover and the middle sheet fixed relative to each other, the adjustable suspension unit further comprise a pair of slide rails slidably engaging the side ways, and the slide rails are fixed on the load support.

14. The support stand as claimed in claim 13, wherein the connecting unit further comprises a second elastic member compressed between one of the rotary wheels and the rear cover, impelling the rotary wheel towards the front cover to create a friction force.

15. The support stand as claimed in claim 10, wherein the support stand further comprises a ball joint comprising a rotatable member having a rotatable portion, a top plate, a bottom plate, and a frame, the top plate, wherein the bottom plate and the frame are fixed to each other and define a groove to rotatably engage the rotatable portion of the rotatable member, and the rotatable member is fixed to the adjustable suspension unit.

16. The support stand as claimed in claim 15, further comprising a supporting bracket fixed to the top plate.

* * * * *